Jan. 3, 1961 B. CORNELISON ET AL 2,966,720

METHOD OF FORMING SEMICONDUCTIVE DEVICES

Filed March 10, 1959 2 Sheets-Sheet 1

INVENTORS

BOYD CORNELISON

ELMER A. WOLFF JR.

BY

Stevens, Davis, Miller & Mosher

ATTORNEYS

INVENTORS
BOYD CORNELISON
ELMER A. WOLFF JR.
BY
Stevens, Davis, Miller & Mosher
ATTORNEYS United States Patent Office 2,966,720

Patented Jan. 3, 1961

2,966,720

METHOD OF FORMING SEMICONDUCTIVE DEVICES

Boyd Cornelison, Dallas, and Elmer A. Wolff, Jr., Richardson, Tex., assignors to Texas Instruments Incorporated, Dallas, Tex., a corporation of Delaware Filed Mar. 10, 1959, Ser. No. 798,417

1 Claim. (Cl. 29—25.3)

The present invention relates to semiconductor devices, and has particular reference to an improved method of fabricating such devices wherein the semiconductive body comprises contiguous zones of opposite conductivity.

The invention seeks to provide a novel method of facilitating the production of diffused junctions in semiconductor material in accordance with predetermined design requirements.

Accordingly, the present invention is directed to producing more uniform collector junction areas formed by the diffusion process without the use as in prior methods of masking and etching which is a tedious process and does not always give uniform results.

Perhaps the outstanding advantage of the new method resides in making the technique for producing the close dimensions necessary for the building of a successful semiconductor device, such as a transistor, much less critical than previously.

Other objects and advantages will be apparent from the following description of several embodiments of the invention. In the description, reference is made to the accompanying drawings of which:

Figure 1A:
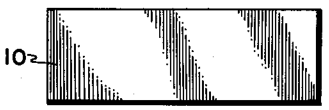
Figures 1A through 1F show an embodiment of the invention illustrating the manufacture of a transistor having a primarily rectangular configuration.

Considering now the details of the illustrated embodiments of the invention, there is provided in Figure 1A a rectangular block 10 of semiconductor material. This starting block 10 may be of either P type or N type semiconductive material. The process may be applied equally well to either type starting material. Rectangular block 10 is then exposed in accordance with well understood techniques, to a select impurity. If the block 10 is of N type conductive material then it is covered by a layer of acceptor impurities. But, if block 10 is of P type conductive material, then it is covered by a layer of donor impurities. These impurities may be applied in any suitable manner, as for example, by vacuum-evaporating, electroplating, or sputtering.

Figure 1B:
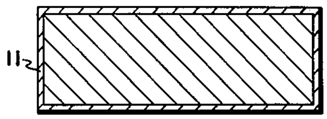

If, for the example in this illustration, block 10 is of N type conductive material and acceptor impurities are used, then by proper regulation of temperature and timing the impurity is caused to diffuse uniformly into the adjacent regions of the N type block converting a zone 11 as shown in Figure 1B into a P type material.

Figure 1C:
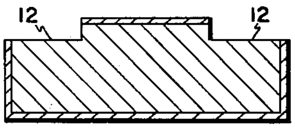

Block 10 then has portions cut away as shown in Figure 1C leaving exposed surfaces 12 of the N type material of block 10.

Figure 1D:
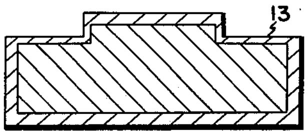

Block 10 is then subjected for a second time to the process of diffusion forming a region 13 of P type material at the exposed surfaces 12. Acceptor impurities are again used for the process of diffusion as used in the first diffusion step. The block 10 with the additional diffused region is shown in Figure 1D. The diffused region 13 of P type material is no longer of uniform thickness all around the block 10 since some surfaces have now been exposed twice to acceptor impurities while other surfaces of the block of N type semiconductive material have only had one exposure because of cutting away of some sections as explained in connection with Figure 1C.

Figure 1E:
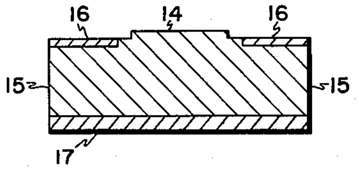

For the next step in the method illustrated other sections of block 10 are cut away leaving exposed surfaces 14 and 15 and diffused junctions of P type material 16 and 17 as shown in Figure 1E.

Figure 1F:
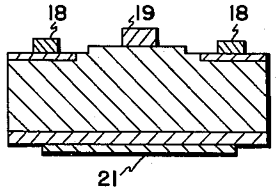

The finished transistor shown in Figure 1F has emitter leads 18 attached to junction regions 16, base 19 on surface 14, and collector 21 on junction region 17. This transistor has a rectangular configuration.

Figure 2A:
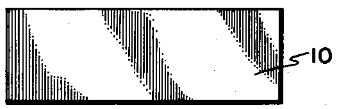
Figures 2A through 2F show another embodiment of the invention illustrating the manufacture of a wedge shaped transistor.
Figure 2B:
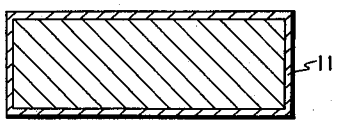
Figure 2C:
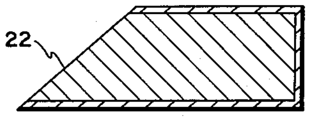
Figure 2D:
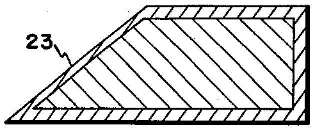
Figure 2E:
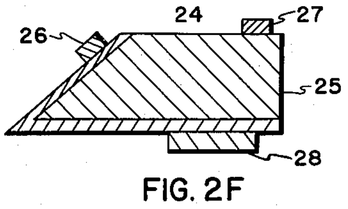
Figure 2F:
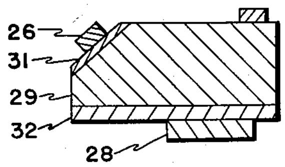

A similar process used to form a wedge shaped transistor starts with an identical block 10 of N type semiconductive material again shown in Figure 2A. Also by a similar process of diffusion forming a P type layer 11 the process is continued in Figure 2B. As next shown in Figure 2C a section of block 10 is cut away forming a wedge with the N type semiconductive material exposed at surface 22. A second diffusion step in Figure 2D covers exposed surface 22 with a P type layer 23. Again sections of block 10 are cut away to at least the depth of penetration of the diffused layer of P type material leaving exposed surfaces 24 and 25 of the N type semiconductive block. A base lead 27 is attached to surface 24 and emitter 26 and collector 28 are attached to different surfaces still having P type layers of material not removed by cutting. The transistor at this point is shown in Figure 2E. In order to obtain the finished transistor illustrated in Figure 2F the emitter and collector regions of the P type layer are separated by lapping or etching, or by a combination of both, thereby leaving separate junctions 31 and 32 having emitter 26 and collector 28 attached respectively.

Figure 3A:
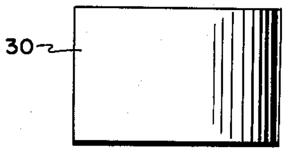
Figures 3A through 3F show a third embodiment of this invention wherein a ring-type conical configuration for a transistor is manufactured.
Figure 3B:
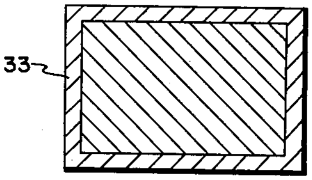
Figure 3C:
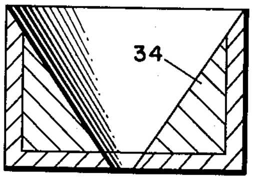
Figure 3D:
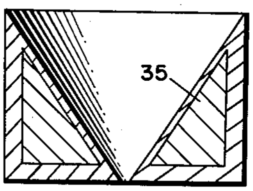
Figure 3E:
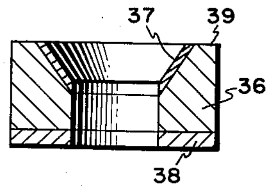

Still another embodiment of the same general process is shown beginning with cylindrical block 30 shown in Figure 3A. Using an N type semiconductive material for this starting block 30, it is subjected to the diffusion process using acceptor impurities as described in the previous embodiments of the invention. A layer 33 of a P type semiconductive region is diffused into the surface of block 30 as illustrated in Figure 3B. A conical cut is then bored through cylindrical block 30 as shown in Figure 3C leaving an exposed conical surface 34. By a second diffusion step illustrated in Figure 3D the surface 34 is covered by a P type layer 35. Other sections are now cut away from the top, circumference, and out of the center leaving the form shown in Figure 3E. Piece 36 of N type material has separate diffused junctions 37 and 38.

Figure 3F:
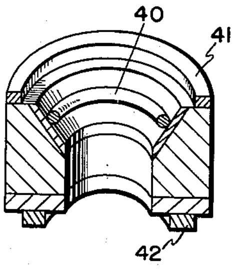

Figure 3F shows a cutaway view of the finished transistor of conical configuration with the leads attached. Circular emitter 40 is attached to conical junction 37 and circular base 41 is attached on surface 39 of the N type material of the original block 30. Circular collector 42 is attached to junction 38.

A simple variation of the technique illustrated in the third embodiment of the invention can be used to produce other forms of circular transistors such as, for example, one having concentric emitters. This is not illustrated since it is only one of many forms that can be produced by the method of fabrication illustrated by this invention.

As has been pointed out previously, the foregoing method can be employed just as well starting with a semiconductor block of P type material and diffusing donor impurities into the block thereby forming layers of N type conductivity.

It will also be apparent that the new method described herein can be used to enable controlled formation of P–N junctions in semiconductive bodies of many prescribed configurations.

From the foregoing, varied application of the novel aspects of the invention will occur to those skilled in the art, and variations in matters of detail will be readily apparent. Therefore, reference should be made to the following claim in determining the full scope of the invention.

What is claimed is:

The method of forming a transistor that comprises the steps of diffusing an impurity of one type conductivity into all surfaces of a wafer having parallel opposite faces and composed of semiconductor material of opposite type conductivity to convert all surface material thereof into said one type conductivity, removing portions of the surface of one face of said wafer to define shoulder portions on which are exposed the original wafer material and to define a raised portion capped by a layer of said one type conductivity, diffusing a second time an impurity of said one type conductivity into all surfaces of said wafer to create a surface layer of said one type conductivity, removing the surface layer at the edge portions of said wafer to separate the surface layers on the opposite faces of said wafer, removing all material of said one type of conductivity from the raised portion on said one face of said wafer to expose the original wafer material, said shoulder portions now characterized by a surface layer of said one type conductivity which defines with the original wafer material an emitter-base P–N junction, said other face of said wafer characterized by a surface layer of said one type conductivity which defines with the original wafer material a collector-base P–N junction, and attaching a base contact to said raised portion, an emitter contact to said shoulder portions, and a collector contact to said opposite face of the wafer.

References Cited in the file of this patent

UNITED STATES PATENTS 2,814,853 Paskell ---------------- Dec. 3, 1957